US008660686B2

(12) United States Patent
Franz

(10) Patent No.: US 8,660,686 B2
(45) Date of Patent: Feb. 25, 2014

(54) METHOD AND DEVICE FOR FIXING AND TRANSPORTING IMPACT SENSITIVE SHEETS IN SPUTTER FEED SYSTEMS

(75) Inventor: Roland Franz, Fuenfstetten (DE)

(73) Assignee: Grenzebach Machinenbau GmbH, Asbach-Baeumenheim (DE)

( * ) Notice: Subject to any disclaimer, the term of this patent is extended or adjusted under 35 U.S.C. 154(b) by 580 days.

(21) Appl. No.: 12/934,303

(22) PCT Filed: Mar. 18, 2009

(86) PCT No.: PCT/DE2009/000371
§ 371 (c)(1),
(2), (4) Date: Sep. 24, 2010

(87) PCT Pub. No.: WO2009/117983
PCT Pub. Date: Oct. 1, 2009

(65) Prior Publication Data
US 2011/0020097 A1  Jan. 27, 2011

(30) Foreign Application Priority Data

Mar. 27, 2008  (DE) .......................... 10 2008 015 982

(51) Int. Cl.
*G06F 7/00* (2006.01)
*B65G 1/133* (2006.01)
(52) U.S. Cl.
USPC ......... 700/213; 700/217; 700/228; 414/749.2
(58) Field of Classification Search
None
See application file for complete search history.

(56) References Cited

U.S. PATENT DOCUMENTS

| 5,259,603 | A | 11/1993 | Geisler et al. |
| 5,909,995 | A | 6/1999 | Wolf et al. |
| 2007/0231111 | A1 | 10/2007 | Heimel et al. |
| 2008/0141943 | A1* | 6/2008 | Matsumoto et al. .......... 118/730 |
| 2008/0298947 | A1* | 12/2008 | Yeo et al. .................. 414/749.2 |
| 2010/0126415 | A1* | 5/2010 | Ishino et al. .................. 118/500 |
| 2010/0175990 | A1* | 7/2010 | Ishino et al. ............. 204/192.12 |

FOREIGN PATENT DOCUMENTS

| DE | 41 36 342 A1 | 5/1993 |
| DE | 41 39 549 A1 | 6/1993 |
| DE | 43 39 813 A1 | 5/1995 |
| DE | 20 2007 015 168 U1 | 1/2008 |

(Continued)

OTHER PUBLICATIONS

Office Action for Japanese Serial No. 2011-501099 Mailed Apr. 24, 2012.

(Continued)

*Primary Examiner* — Yolanda Cumbess
(74) *Attorney, Agent, or Firm* — Brinks Gilson & Lione

(57) ABSTRACT

The invention relates to a device and method for fixing glass sheets in a superclean room for feeding a sputter system, comprising the following: a) a roller drive (12), designed to convey a transport frame (19) to a centering unit that centers the transport frame (19) horizontally and to convey the frame from the unit to a sputter system; b) a frame lifting device (7) which lifts and lowers the transport frame (19) in a magnetic rail mounting (2); c) a fixing unit (5, 8) which fixes and releases the transport frame (19), opening heads (3) being provided for opening and closing frame clips (17) that receive a glass plate (18); d) a lifting unit for lifting and pivoting said glass plate (18), the unit bringing the plate into a vertical position and placing said plate in the transport frame (9).

8 Claims, 9 Drawing Sheets

(56) References Cited

FOREIGN PATENT DOCUMENTS

| | | |
|---|---|---|
| DE | 10 2008 015 982 B3 | 7/2009 |
| EP | 1 840 242 A1 | 3/2006 |
| JP | 02-207546 | 3/1992 |
| JP | 06-69316 | 10/1995 |
| JP | 2005-289556 | 3/2006 |
| JP | 2004-296672 | 4/2006 |
| JP | 2006-8311 | 8/2007 |
| JP | 2007-227626 | 3/2009 |

OTHER PUBLICATIONS

International Search Report Dated Aug. 10, 2009.
Notification of Opposition Dated Oct. 28, 2009.
Opposition Dated Oct. 22, 2009, Submitted with Office Action Dated Nov. 25, 2009.
Omanz Automation, Specification 080307, Rev. 2, Automation New Aristo 1400, Project Chi-Mei Fab3 Dated Aug. 21, 2003.
Ormanz Automation Invoice, Aug. 24, 2004.
Final Acceptance Certificate_03.
Enclosures to Opposition 04-013.
Response to Opposition Dated Feb. 17, 2010.
Answer of Opponent Dated Jun. 10, 2010, Submitted with Office Action Dated Jul. 7, 2010.
Answer of Patent Owner (Grenzebach), Sep. 2010.
Office Action for Korean Office Action Serial No. 10-2010-7024029, Dated Aug. 23, 2012.

* cited by examiner

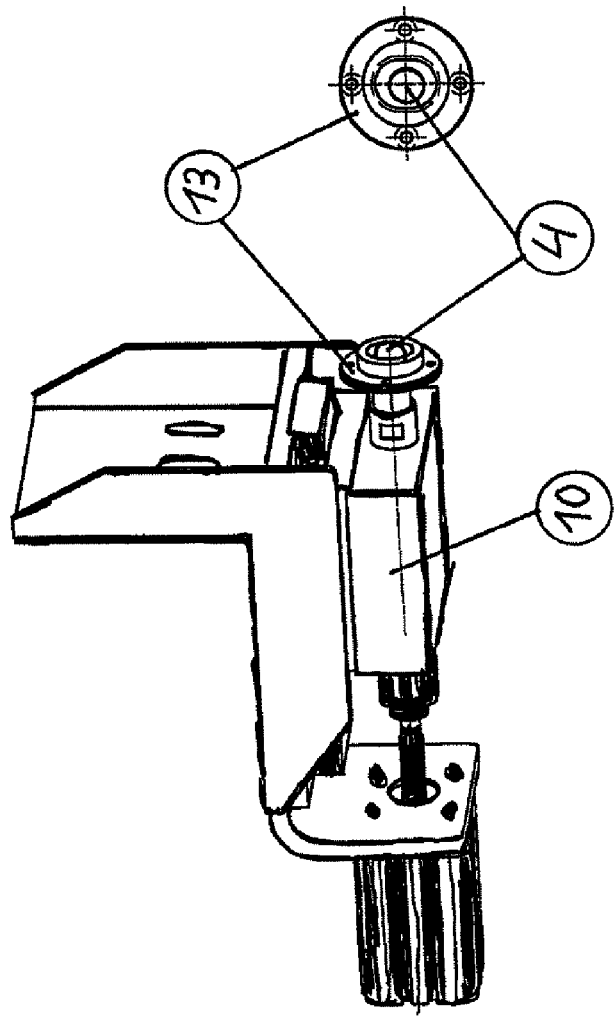

METHOD AND DEVICE FOR FIXING AND TRANSPORTING IMPACT SENSITIVE SHEETS IN SPUTTER FEED SYSTEMS

CROSS-REFERENCE TO RELATED APPLICATIONS

This application is a national stage application under 35 U.S.C. 371 of international application number PCT/DE2009/000371 filed Mar. 18, 2009 (WO 2009/117983) and also claims priority to German application number 10 2008 015982.4 filed Mar. 27, 2008, all of which are hereby incorporated by reference in their entirety.

SUMMARY

A large number of technical devices appertaining to our everyday necessities require a sputter coating during production. We find these layers in hard disks of computers, CD storage media and LCD flat screens, sputter bearings, modern thermal protective glass, mirrors, halogen emitters or automobile headlights. All these useful things cannot be realized without coatings by means of sputtering.

The English expressions "to sputter", "sputtering" denote the process of cathode sputtering. In this case, argon ions impinge on a cathode (the so-called target), at which a typical electrical voltage of 500 volts is present. When the ions impinge, atoms are released from the cathode and condense in the surroundings, which leads to the growth of a layer. Important components for sputter coating are the so-called magnetrons (a cathode with integrated magnetic system) and a vacuum chamber (receiver chamber).

In many cases, the material to be coated is large glass sheets. The production and further processing of such shock-sensitive sheets is also required in the production of flat screens of relatively large design and in a large quantity. With regard to the history:

Modern flat screens are increasingly replacing the old tube monitors, and are also becoming less and less expensive.

They are based on TFT/LCD technology. In this context, LCD (Liquid Crystal Display) represents the use of liquid crystals in the individual pixels of the screen, and TFT stands for "Thin Film Transistor". The TFTs are very small transistor elements which control the orientation of the liquid crystals, and therefore the light transmission thereof.

A flat screen display consists of numerous pixels. Each pixel in turn consists of three LCD cells (subpixels), corresponding to the colors red, green and blue. A 15-inch screen (measured diagonally) contains about 800 000 pixels or approximately 2.4 million LCD cells.

With regard to understanding the mode of operation:

A liquid crystal cell (LCD cell) works in a similar manner to polaroid sunglasses. If two polaroid glasses are held one above the other and begin to be turned with respect to each other, it is initially possible to see less and less and then nothing at all. This effect arises because polaroid glass is transmissive only to light waves which vibrate in a specific plane. If two such glasses are held one above the other and turned by 90° with respect to each other, some of the light can still pass through the first glass, but no longer through the second glass, since this is then transverse to the incoming light waves and filters them out.

An LCD cell works on the same principle. It consists of two polaroid glasses which are turned by 90° with respect to each other and through which no light can therefore pass, in accordance with the above explanation. A layer of liquid crystals, which has the natural property of rotating the vibration plane of light, is located between these two polaroid glasses. This layer of liquid crystals is just thick enough that the light passing through the first polaroid glass is rotated back by 90°, and can therefore also pass through the second polaroid glass, that is to say becomes visible to the viewer.

If the liquid crystal molecules are then rotated away from their natural position by the application of an electrical voltage, less light passes through the cell and the corresponding pixel becomes dark. The corresponding voltage is produced by a TFT element which is part of every LCD cell. The light for the LCD display is produced in the rear part of the screen housing by small fluorescent tubes, as are used on a larger scale for illuminating rooms.

Since each pixel has three color filters for the colors red, green and blue, the control of the transmissivity of these filters means that each pixel can assume a desired color mixture or a desired color.

For standard office applications, flat screens have outstanding sharpness and a sufficient color quality. In ergonomic terms, TFTs also have much to offer: smaller space requirement, a power consumption which is only a third of that of a tube monitor and significantly lower emission of radiation.

As is conventional in microelectronics, the production of TFT screens requires so-called ultraclean rooms. This is necessary because, in view of the small size of the line-carrying structures, even small particles can cause line interruptions during the production process. In the case of production of a TFT screen, such a line interruption would result in the failure of a pixel.

Therefore, the production of such screens requires ultraclean room conditions.

A clean room, or an ultraclean room, is a room in which the concentration of airborne particles is controlled. It is constructed and used in such a way that the number of particles introduced into the room or produced and deposited in the room is as small as possible, and other parameters, such as temperature, humidity or air pressure, are controlled as required.

On the one hand, TFT screens are currently becoming less and less expensive, and on the other hand the demand for screens with enormous proportions is increasingly standing out, all the more so because screens of this type firstly can be used very easily at major events and secondly are available in affordable price ranges due to modern production technology.

However, the production of large screens requires special machines even in ultraclean rooms to handle the large-surface-area, thin glass sheets required in this case.

The prior art discloses, in DE 199 05 882 C1, according to the preamble of claim 1, a device for transporting articles, in particular wafers or wafer holders, between a first clean room and a second clean room, which can be associated with different clean room classes and in which different air pressures prevail.

This device addresses the problem of proposing a transport device which reduces the requirements made of the control software of the device and, in conjunction with likewise reduced transport times, enables the articles to be reliably transported from and to the processing stations. Said problem is solved by a vertical conveyor, which is led through an opening in a sealing of the first clean room and a floor of the second clean room and the vertically movable conveying element of which has a first end position, which is situated within the first clean room, and a second end position, which is situated within the second clean room, a lock unit blocking the cross section of the vertical conveyor, said lock unit having two lock doors that are spaced apart in the conveying direction and delimit a lock chamber situated between them, and at least one handover unit by which a respective article can be handed over from a transport system situated in the second clean room to the conveying element in its second end position, and in the opposite direction, and/or from the conveying element in its first end position to a processing station situated in the first clean room, and in the opposite direction, one of the end positions of the conveying element being arranged within the lock chamber.

Although the transport of the wafers takes place under clean room conditions, the transport of large glass sheets is evidently not of primary importance here.

However, the production of large screens requires the use of special machines even in ultraclean rooms to handle the large-surface-area, thin glass sheets required in this case.

For this purpose, it is possible to use primarily multi-axle industrial robots.

The use of a wide variety of embodiments of multi-axle industrial robots in technology for producing a wide variety of products can be gathered from the prior art.

Industrial robots of this type are used in large halls mostly for transporting unwieldy and heavy loads, but can also be used beneficially in the production of smaller machine parts. What matters in all cases is the reproducible precision of the movement sequences of the individual grasping operations, transport movements and setting-down operations.

Here, the circumstances under which these movement sequences take place are unimportant in many cases. For example, it is mostly immaterial what noise emission such a movement sequence causes, or whether such an operation is associated with the movement of dust or a greater or lesser escape of lubricant. Unavoidable abrasion of moving machine parts which cause friction is also mostly insignificant.

By contrast, natural ramifications of this type must be taken into consideration when working in an environment at risk from contamination, for example in the food-processing industry, in the pharmaceutical industry or even in the production of semiconductors in ultraclean rooms.

Thus, the prior art discloses, in EP 1 541 296 A1, a manipulator, such as an industrial robot, for use in an environment at risk from contamination, having a number of scavenging chambers, which can be charged with a scavenging medium, in the region of drive units of the manipulator. The problem to be solved in the case of such a device is to further develop the device to such an extent that the manipulator can safely be used in an environment at risk from contamination in a structurally simple manner and therefore, in particular, at low cost.

This problem is solved by a dedicated scavenging chamber being associated with each of a plurality of groups of drive units (claim 1).

Although the environment in which such an industrial robot is intended to be used is more sensitive to contamination and therefore also places higher demands on the design configuration by comparison with a normal environment, special demands of this type cannot be compared with the conditions stipulated in ultraclean rooms.

Apart from what has been mentioned above, large, thin glass sheets such as are also used for producing large TFT screens are extremely sensitive to very small impacts owing to their crystalline structure and concurrent relatively large mass. Therefore, an industrial robot is also unsuitable for handling large, thin glass sheets in ultraclean rooms because it lacks sensitivity and in some cases may lack positional accuracy.

Under ultraclean room conditions, particular care and attention is required for conveying large, impact-sensitive glass sheets in the horizontal orientation and the rotation thereof.

A further aspect when maintaining ultraclean room conditions, particularly when producing cost-intensive products, is the risk of contamination by people. Here, unintended sneezing can destroy a whole production unit. Likewise, such a system requires increased reliability since failure, including with regard to the products to be supplied, causes high costs.

DE 41 39 549 1A1 discloses a device for transporting sheet-type substrates in and through vacuum treatment systems comprising a plurality of stations, wherein substrate holders of approximately sheet-type configuration can be moved in a perpendicular position along a predetermined transport path through the stations.

U.S. Pat. No. 5,909,995 A also discloses a device for transporting substrates through a vacuum system by means of mounts.

Both documents essentially teach particular forms of roller drives for substrates which are placed into transport frames and which are conveyed by means of a roller drive and in a magnetically guided manner.

DE 41 36 342 A1 teaches diverse clamping devices for fastening sheet-type substrates on transport frames. The clamping devices are suitable for automatic placement.

DE 43 39 813 A1 teaches a method and a device for transferring sheet-type substrates from a horizontal bearing table into a perpendicular supporting rack.

No suggestion for the treatment of large, thin glass sheets in a sputtering process under ultraclean room conditions can be inferred from the cited prior art.

Therefore, the device according to the invention and, respectively, the method according to the invention address the problem of ensuring a production process, or a delivery to a specific production process, which can take place without intervention by people, but in a manner controlled and monitored by people outside production, in the sputtering process of large, thin glass sheets under ultraclean room conditions.

The corresponding device has to be reliable and inexpensive to produce.

This problem is solved by means of a device according to claim 1 and a method according to claim 8.

Further aspects of this application will become readily apparent to persons skilled in the art after a review of the following description, with reference to the drawings and claims that are appended to and form a part of this specification.

BRIEF DESCRIPTION OF THE DRAWINGS

The device according to the invention is described in greater detail below. In the figures, specifically:

FIG. 4 shows the mandrel guide of the centering unit.

DETAILED DESCRIPTION

Figure 1:
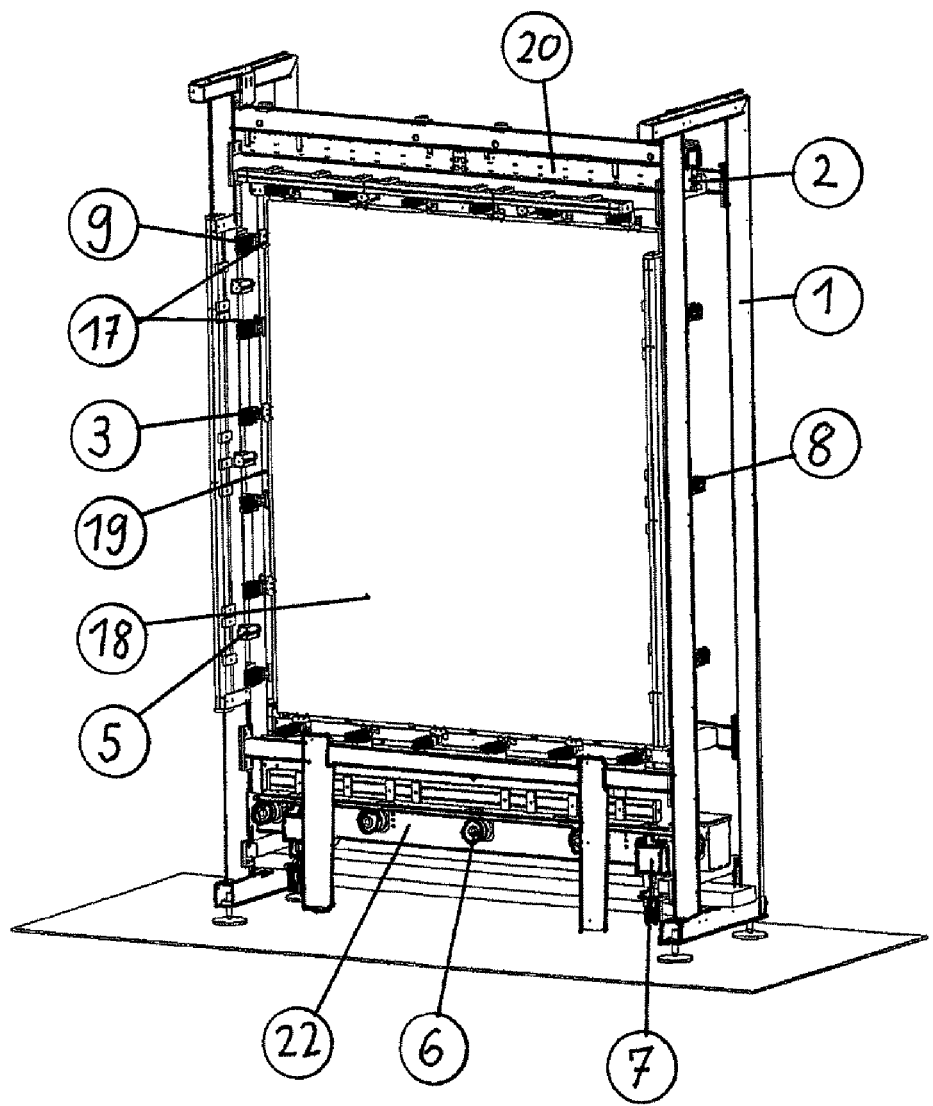
FIG. 1 shows a device according to the invention in perspective view, from the front side.

FIG. 1 illustrates the device according to the invention in perspective view as viewed from the front side. The basic frame (1) consists of two side parts, which each consist of two parallel, interconnected profile parts and which are connected via cross braces in the lower and upper regions. In the upper region of this basic frame construction, a magnetic rail mount (2) for the transport frame (19) is provided as a connection of the two side parts. In the lower region of this frame construction, a further cross brace is fitted, which simultaneously serves, inter alia, as a support for rollers (6) of a frame transport device.

Figure 2:
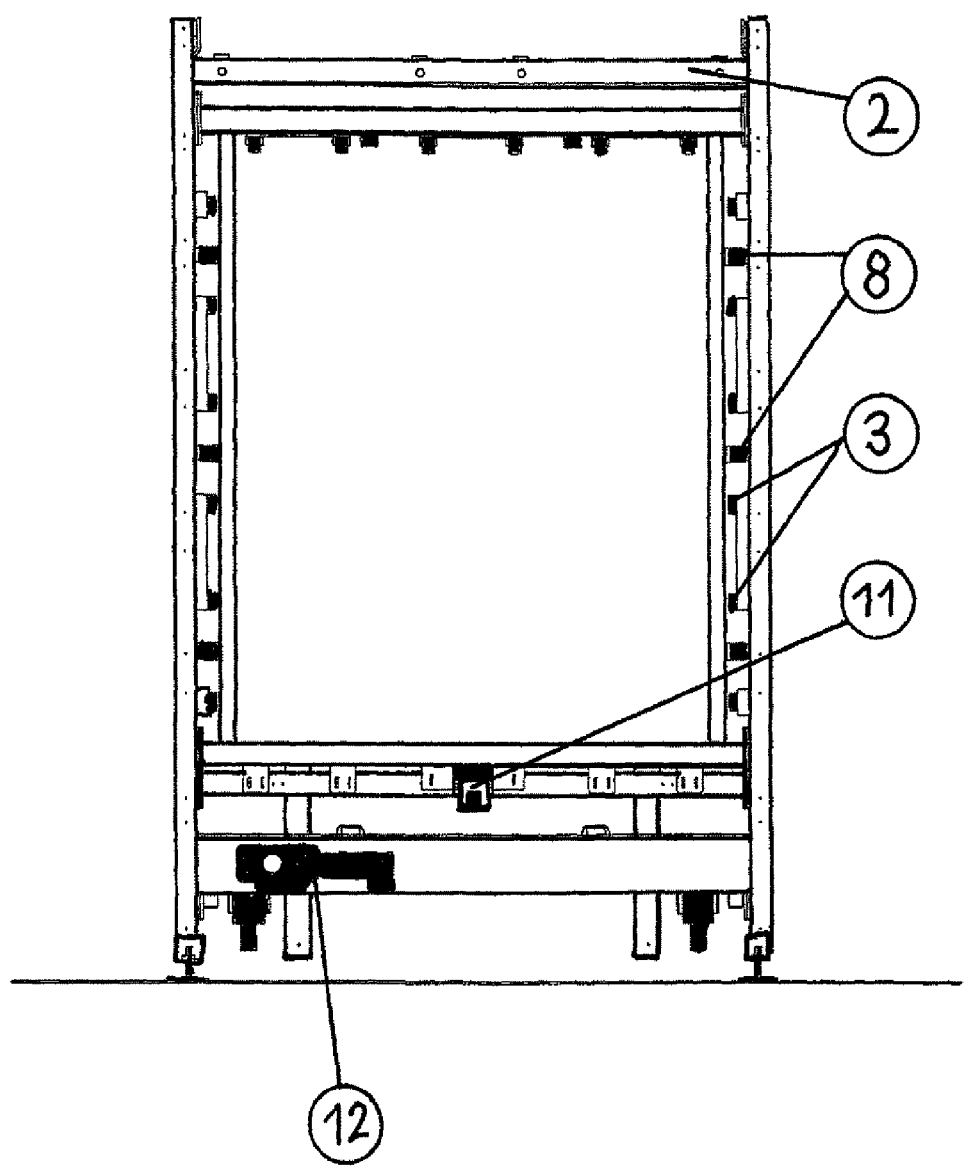
FIG. 2 shows a device according to the invention viewed from the rear side.

In the rear view, as illustrated in FIG. 2, the magnetic rail mount (2) can again be discerned, and a further elements (5, 8) is in total eight, to be precise three on each of the sides of the transport frame (19) and two on the top side. A more precise illustration is evident from the further figures.

In the illustration in FIG. 2, the device according to the invention can be seen from the rear side. Here as well, once again, as in FIG. 1, by way of example two opening heads (3) and two pressure cylinders (8) of the frame fixing are designated on the right-hand side. Overall, as can be seen from the drawing, another pressure cylinder (8) is depicted on the right-hand side, a further three pressure cylinders (8) are depicted on the left-hand side, and another two pressure cylinders (8) are depicted on the upper side. In this illustration, the movement cylinder (11) of the centering unit can be discerned in the center in the lower region and the drive (12) of the rollers (6) can be discerned on the left-hand side.

Figure 3:
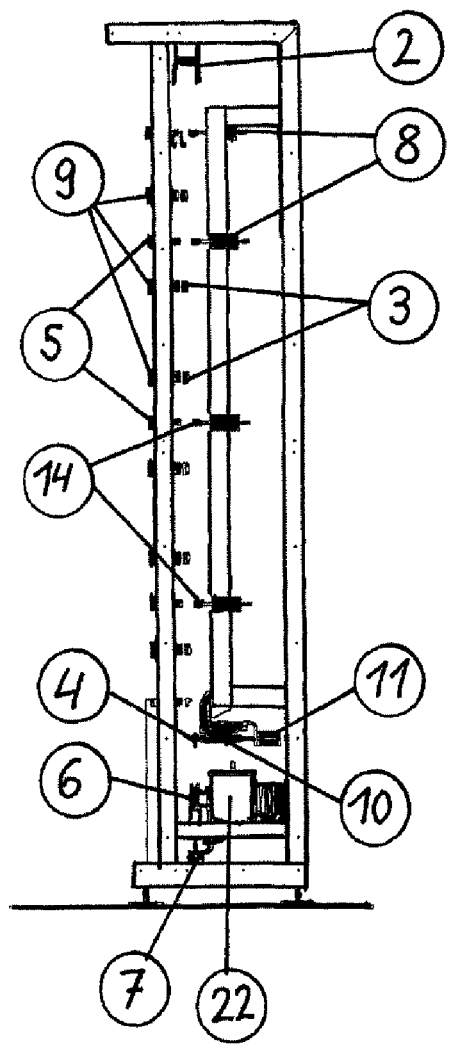
FIG. 3 shows a side view of the device according to the invention.

FIG. 3 illustrates the device according to the invention in a side view. In addition, the transport frame (19) in conjunction with the magnetic rail (20) on the upper side and the associated runner (21) on the lower side has been depicted separately on the same sheet in FIG. 3a. This is because the transport frame (19) is not shown in FIG. 3, for reasons of clarity.

Figure 3A:
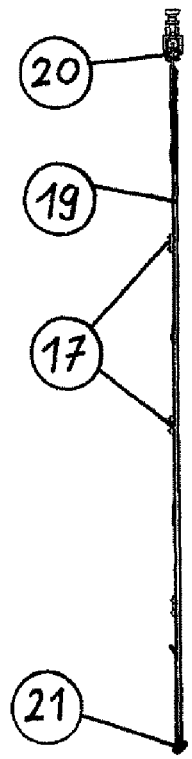
FIG. 3*a* shows a side view of the transport frame.

The illustration in FIG. 3 in conjunction with the transport frame shown in section in FIG. 3a reveals, however, how the transport frame (19) is mounted with its magnetic rail (20) in the magnetic rail mount (2) in FIG. 3. The magnetic rail (20), which is configured in U-shaped fashion in the lower region, thus moves in the magnetic rail mount (2), which is likewise configured in U-shaped fashion. In this case, the runner (21) of the transport frame (19) runs in the rollers (6), which are likewise shown in FIG. 3. In the region of the rollers (6), FIG. 3 also illustrates the roller drive (12), the roller gear mechanism (22) and the frame lifting unit (7).

For more detailed explanation of the function of the device according to the invention, the movement sequence when equipping the transport frame (19) with a glass sheet (18) is described below.

The glass sheet (18) to be treated in the sputter system is brought from a horizontal position into a vertical position and then placed into the transport frame (19) by a device for the contamination-free transfer of such sheets.

By way of example, a device according to DE 102007 052 182.2, not previously published, in the name of the present applicant is suitable for this purpose.

Said document relates to a device for the contamination-free transfer of thin, impact-sensitive crystalline sheets, in particular glass sheets (11), from a horizontal position into a defined vertical position, comprising the following features:

a) a glass sheet supplied via rollers with a respective dedicated drive in the ultraclean room is halted in the region of a transfer unit, b) the glass sheet is grasped by providing, underneath the latter, a transverse strut of a transfer fork with suction head support struts fastened perpendicularly thereon, the top side of the struts having suction heads which are distributed over the length thereof and pass through the free space between the rollers, c) the suction heads are moved toward the underside of the glass sheet and the suction elements of said suction heads are connected to the glass sheet by suction air, d) the glass sheet thereby connected to the transfer fork is pivoted by the latter into a vertical position, e) after fine adjustment, the glass sheet is placed into the setting-down device, here the transport frame, f) the suction heads are released from the glass sheet.

In this case, the transport frame (19) serves as a delivery device after corresponding preparation for opening said frame.

For this purpose, a roller drive (12) conveys the runners (21) of a perpendicular transport frame (19) suitable for the respective glass sheet (18), said transport frame being guided on the top side in a magnetic rail mount (2), to a centering unit that firstly centers the transport frame (19) in the horizontal.

The centering unit is described in greater detail in FIG. 4.

The movement cylinder (11)—also illustrated in FIG. 3 and in FIG. 2—of the centering unit instigates the movement of the centering mandrel (4) out from the mandrel guide (10) of the centering unit. During its movement, the centering mandrel (4) meets a vertically extending slot in the transport frame (19), in this way centers the transport frame in a horizontal direction and, in the further course of the movement, also establishes a connection to said transport frame via the centering plate (13).

Two frame lifting units (7) then lift the transport frame (19) in the magnetic rail mount (2) by a small amount. They are illustrated on the left-hand side and on the right-hand side in the lower region of FIG. 1 and FIG. 3. They act on the runner (21) of the transport frame (19) in a vertical direction.

A fixing unit (5, 8) subsequently fixes the transport frame (19) and then opening heads (3) in the region of the longitudinal sides of the transport frame (19) open frame clips (17).

The fixing unit (5, 8) respectively comprises pressure cylinders (8) of the frame fixing and counter-cylinders (5) of the frame fixing which occur in pairs. The number of these elements (5, 8) is eight in total, to be precise three on each of the sides of the transport frame (19) and two on the top side. Their function can be discerned particularly clearly in FIG. 3, in which a pressure cylinder (8) and a counter-cylinder (5) respectively situated opposite one another can be discerned, a fixing head (14) being designated at the lower pressure cylinder of three pressure cylinders (8) shown.

Figure 5:
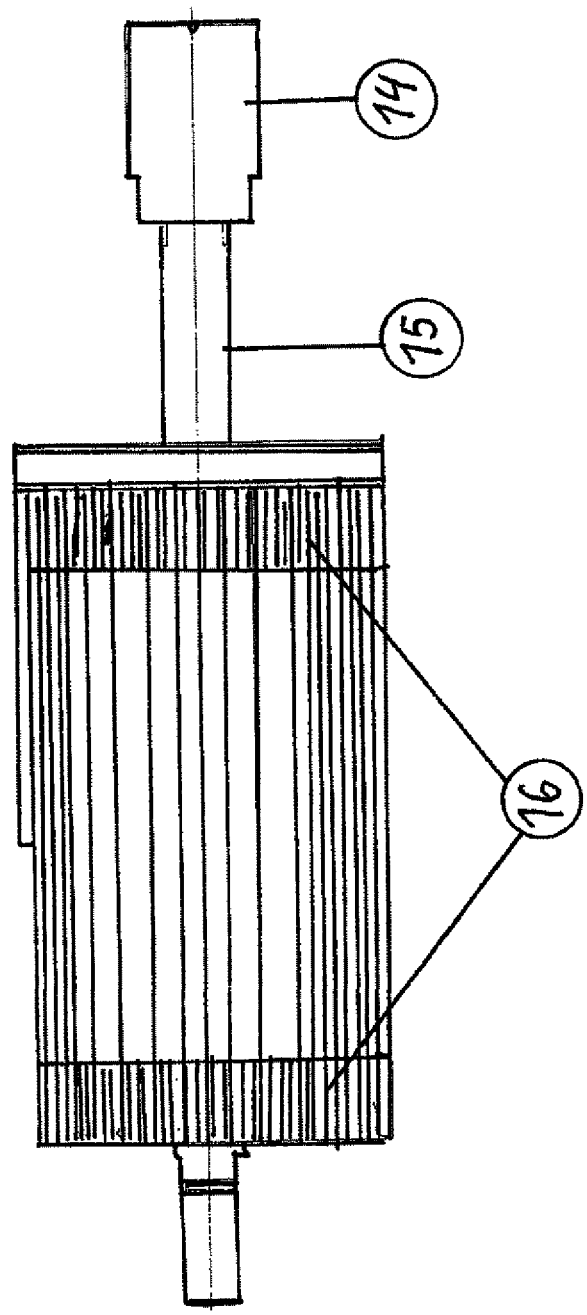
FIG. 5 shows a bearing element for frame fixing.

FIG. 5 illustrates a pressure cylinder (8) in detail. It consists principally of a bearing element (16), a piston rod (15) moved in said bearing element (16), and also a fixing head (14) fastened to the end of said rod. What is essential to the pressure cylinder (8) is the feature that both the piston rod (15) and the bearing element (16) are equipped with an air suction extraction device.

Figure 6:
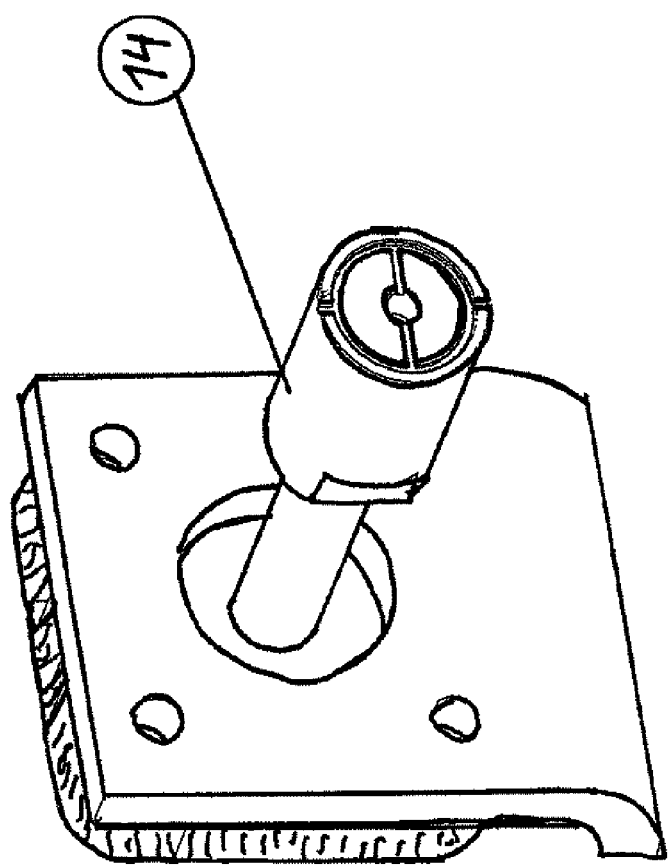
FIG. 6 shows a fixing head of a bearing element from FIG. 5.

FIG. 6 shows the configuration of the pressure surface by which fixing head (14) is pressed onto the transport frame (19). The ways in which the air drawn in by suction carries away particles possibly adhering to the transport frame (19) and contributes to keeping the ultraclean room clean are clearly discernible here.

Figure 7:
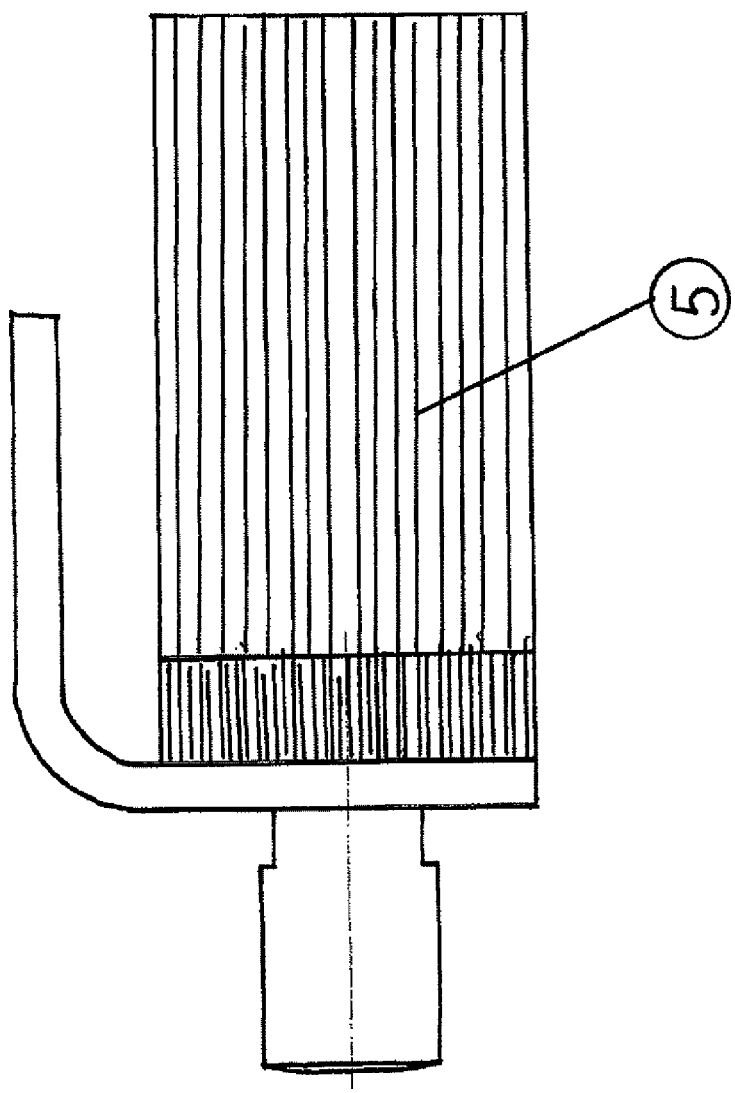
FIG. 7 shows a counter bearing of the frame fixing from FIG. 5.

FIG. 7 illustrates a counter-cylinder of the frame fixing (5) in detail. At its pressure surface it can also have a similar structure to that of the fixing head (14) and be connected to an air suction extraction device.

Figure 8:
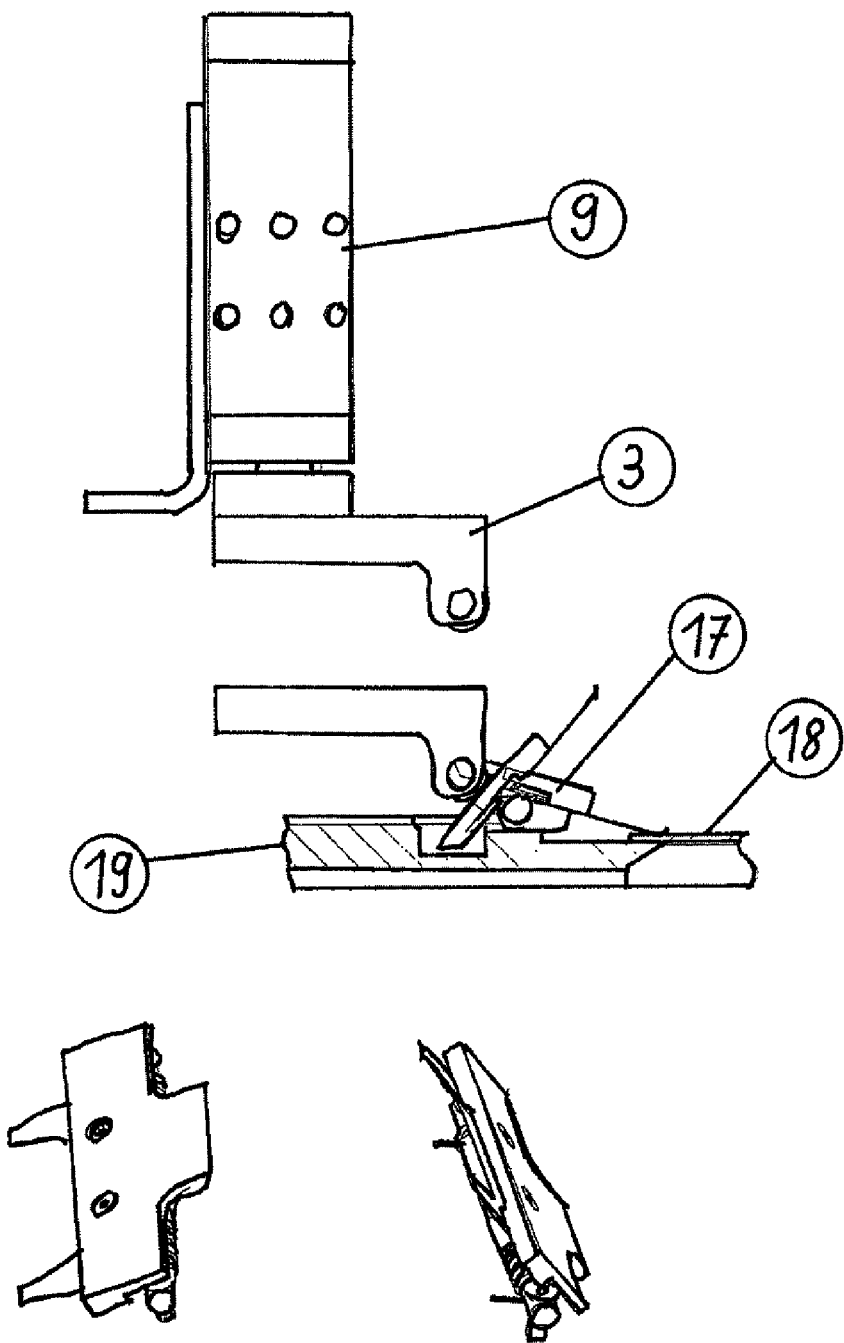
FIG. 8 shows an illustration of the fastening mechanism of a frame clip.

FIG. 8 shows an illustration of the fastening mechanism of a frame clip (17) in conjunction with the transport frame (19) and an inserted glass sheet (18).

FIG. 1 and FIG. 3 show opening pressure cylinders (9) and opening heads (3) by way of example in an overall context. The illustration of the function in FIG. 8 reveals how an open position and a closed position of an opening head (3) affect the snap-action mechanism of a frame clip (17). It is clear here that when the piston rod of the opening pressure cylinder (9) moves out therefrom this exerts a pressure on the counter-bearing of the bearing—produced from spring steel—of the frame clip (17) and, consequently, the latter has to rotate about the articulation shown, which in turn results in the frame clip hinging upward.

On the same sheet, a frame clip (17) is illustrated respectively in two different views.

Figure 9:
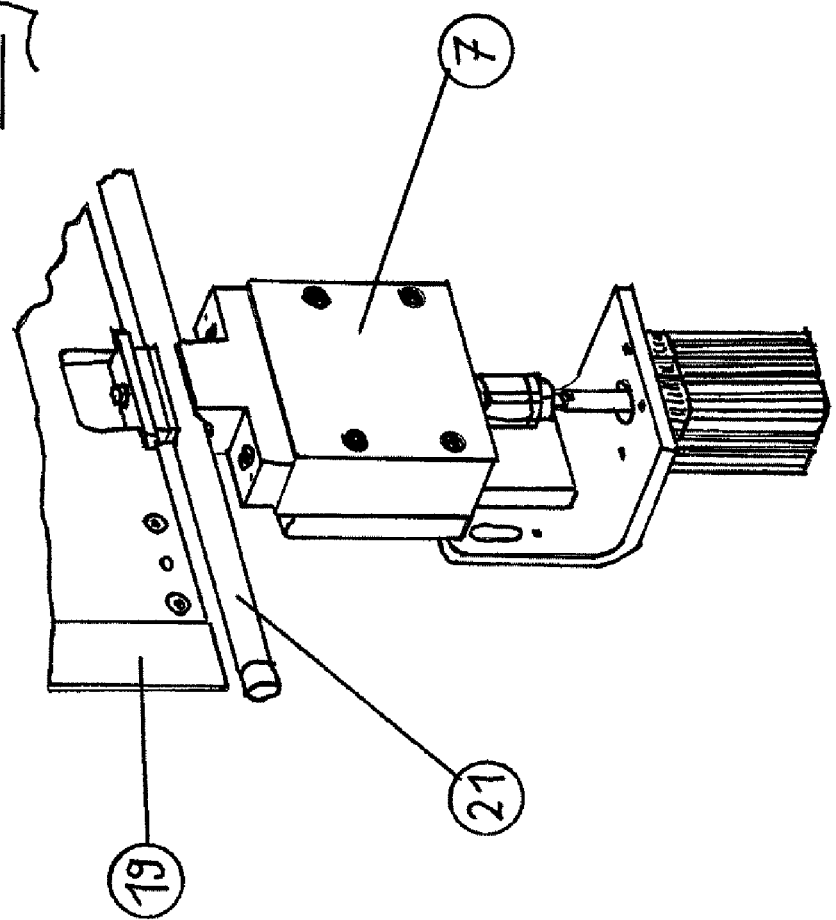
FIG. 9 shows a perspective illustration of the lifting mechanism.

FIG. 9 illustrates details of a lifting unit (7) in conjunction with the runner (21) of the transport frame (19).

With the final fixing of the transport frame (19) and the opening of the frame clips (17), said transport frame is ready to receive a glass sheet (18).

A transfer device that comes into action in the sequence lifts the glass sheet (18) to be coated, said glass sheet being supplied in a horizontal position by a transport device, brings it into a vertical position, displaces it approximately parallel and then places it into the transport frame (19), and then the opening heads (3) close all the frame clips (17).

The desired, exactly positioned, connection of a glass sheet (18) to a centered transport frame (19) is thus established.

The fixing unit (5, 8) then frees the transport frame (19) loaded with the glass sheet (18), the frame lifting unit (7) lowers the transport frame, the centering unit is released from the transport frame (19) and the roller drive (12) brings the transport frame (19) with the glass sheet (18) into the sputtering region.

The sensors and control elements required for the automatically preceding conveying operation and processing operation described are clearly apparent to the person skilled in the art and have not been illustrated for reasons of clarity.

The interactive control of the movement elements, control elements and sensors used in each case requires a special control program.

As a person skilled in the art will readily appreciate, the above description is meant as an illustration of implementation of the principles this application. This description is not intended to limit the scope or application of this invention in that the invention is susceptible to modification, variation and change, without departing from the spirit of this invention, as defined in the following claims.

LIST OF REFERENCE SYMBOLS (1) Basic frame
(2) Magnetic rail mount
(3) Opening head
(4) Centering mandrel
(5) Counter-cylinder of the frame fixing
(6) Rollers of the frame transport device
(7) Frame lifting unit
(8) Pressure cylinder of the frame fixing
(9) Opening pressure cylinder
(10) Mandrel guide of the centering unit
(11) Movement cylinder of the centering unit
(12) Drive of the rollers
(13) Centering plate
(14) Fixing head of the frame fixing
(15) Piston rod with suction extraction device
(16) Bearing element with suction extraction device (frame fixing)
(17) Frame clip
(18) Glass sheet
(19) Transport frame
(20) Magnetic rail
(21) Runner of the transport frame
(22) Roller gear mechanism

The invention claimed is:

1. A device for fixing and transporting impact-sensitive glass sheets, in an ultraclean room for feeding a sputter system, comprising the following features:
   a) a roller drive for conveying a plurality of runners of a perpendicular transport frame suitable for a glass sheet, said transport frame being guided on a top side in a magnetic rail mount to a centering unit that centers the transport frame in the horizontal, the roller drive further being configured for conveyance of the transport frame to a sputter system,
   b) a frame lifting unit serves for lifting and lowering the transport frame in the magnetic rail mount,
   c) a fixing unit operable to fix and release the transport frame, wherein opening heads are present in a region of the longitudinal sides and the top side of the transport frame for opening and closing a plurality of frame clips for receiving the glass sheet,
   d) a transfer device, for the glass sheet to be coated, is operable to lift and pivot the glass sheet, which is supplied in a horizontal position by a transport device, said transfer device bringing said sheet into a vertical position and then placing the glass sheet into the transport frame.

2. The device as claimed in claim 1, wherein the transport frame comprises an aluminum alloy, a guide comprising an iron alloy being attached in an upper region of the transport frame.

3. The device as claimed in claim 2, wherein the fixing unit respectively comprises counter-cylinders and pressure cylinders, the pressure cylinders comprising an air suction extraction device.

4. The device as claimed in claim 3, wherein the magnetic rail mount comprises two linear magnetic elements arranged opposite one another, between which the upper edge of the transport frame is arranged such that the transport frame is repelled by both magnetic elements.

5. The device as claimed in claim 1, wherein the centering unit has a centering mandrel guided in a slot, said centering mandrel being moved out from a mandrel guide by a movement cylinder for centering the transport frame.

6. The device as claimed in claim 1, wherein each of the plurality of frame clips comprise spring steel and a mount composed of metal or a plastic suitable for a clean room.

7. The device as claimed in claim 1, wherein the glass sheet to be coated is placed into the transport frame by the transfer device, the transfer device being operable to provide contamination-free transfer of glass sheets from a horizontal position into a vertical position, said transfer device comprising the following features:
   a) rollers with a respective dedicated drive in the ultraclean room,
   b) a transfer fork with suction head support struts fastened perpendicularly thereon, the top side of the struts having suction heads which are distributed over the length thereof and pass through free space between the rollers,
   c) the suction heads have suction elements,
   d) the transfer fork is pivotable into a vertical position.

8. A device for fixing and transporting impact-sensitive glass sheets, in an ultraclean room for feeding a sputter system, comprising the following features:
- a) a roller drive for conveying a plurality of runners of a perpendicular transport frame being suitable for a glass sheet, said transport frame being guided on a top side in a magnetic rail mount to a centering unit that centers the transport frame in the horizontal, the roller drive further being configured for conveyance of the transport frame to a sputter system, wherein the centering unit has a centering mandrel guided in a slot, said centering mandrel being moved out from a mandrel guide by a movement cylinder for centering the transport frame,
- b) a frame lifting unit operable to lift and lower the transport frame in the magnetic rail mount,
- c) a fixing unit operable to fix and release the transport frame, wherein opening heads are present in a region of the longitudinal sides and the top side of the transport frame for opening and closing a plurality of frame clips for receiving a glass sheet,
- d) a transfer device for the glass sheet to be coated serves for lifting and pivoting the glass sheet, which is supplied in a horizontal position by a transport device, said transfer device bringing the glass sheet into a vertical position and then placing it into the transport frame.

\* \* \* \* \*